United States Patent
Brien et al.

(10) Patent No.: US 12,217,980 B2
(45) Date of Patent: Feb. 4, 2025

(54) APPARATUS FOR PROCESSING A WAFER, AND METHOD OF CONTROLLING SUCH AN APPARATUS

(71) Applicant: LAM RESEARCH AG, Villach (AT)

(72) Inventors: Daniel Brien, Villach (AT); Pradeep Thirugnanam, Villach (AT); Matija Ponikvar, Villach (AT); Alois Goller, Villach (AT)

(73) Assignee: LAM RESEARCH AG, Villach (AT)

( * ) Notice: Subject to any disclaimer, the term of this patent is extended or adjusted under 35 U.S.C. 154(b) by 605 days.

(21) Appl. No.: 17/424,994

(22) PCT Filed: Jan. 3, 2020

(86) PCT No.: PCT/EP2020/050076
§ 371 (c)(1),
(2) Date: Jul. 22, 2021

(87) PCT Pub. No.: WO2020/151932
PCT Pub. Date: Jul. 30, 2020

(65) Prior Publication Data
US 2022/0084848 A1    Mar. 17, 2022

(30) Foreign Application Priority Data
Jan. 23, 2019 (GB) .................... 1900912

(51) Int. Cl.
*H01L 21/67* (2006.01)
*H01L 21/687* (2006.01)

(52) U.S. Cl.
CPC .. *H01L 21/67115* (2013.01); *H01L 21/67248* (2013.01); *H01L 21/68764* (2013.01)

(58) Field of Classification Search
CPC ......... H01L 21/67115; H01L 21/67428; H01L 21/68764; H05B 3/0047
See application file for complete search history.

(56) References Cited

U.S. PATENT DOCUMENTS

| 6,479,801 B1* | 11/2002 | Shigeoka | ............... G01J 5/0003 |
| | | | 392/416 |
| 2003/0236642 A1* | 12/2003 | Timans | ..................... G01J 5/08 |
| | | | 702/99 |

(Continued)

FOREIGN PATENT DOCUMENTS

| EP | 3324240 A1 | 5/2018 |
| JP | H03259511 A | 11/1991 |

(Continued)

OTHER PUBLICATIONS

International Search Report and Written Opinion of the ISA issued in PCT/EP2020/050076, mailed Mar. 13, 2020; ISA/EP.

(Continued)

*Primary Examiner* — Shawntina T Fuqua

(57) ABSTRACT

An apparatus for processing a wafer comprises: a rotatable chuck adapted to receive a wafer; a heating assembly comprising an array of light-emitting heating elements arranged to illuminate a wafer received by the rotatable chuck to heat the wafer; and one or more light sensors arranged to detect light emitted by the array of light-emitting heating elements.

18 Claims, 5 Drawing Sheets

(56) References Cited

U.S. PATENT DOCUMENTS

| | | | |
|---|---|---|---|
| 2004/0018008 A1* | 1/2004 | Koren | C30B 25/105 |
| | | | 392/416 |
| 2008/0002753 A1 | 1/2008 | Timans | |
| 2010/0267174 A1 | 10/2010 | Moffatt | |
| 2012/0076476 A1 | 3/2012 | Kusuda et al. | |
| 2013/0248504 A1 | 9/2013 | Kusuda | |
| 2014/0330422 A1* | 11/2014 | Ranish | H01L 21/67115 |
| | | | 700/121 |
| 2015/0093100 A1 | 4/2015 | Ranish | |
| 2017/0316963 A1 | 11/2017 | Parkhe | |
| 2017/0345681 A1 | 11/2017 | Mui et al. | |

FOREIGN PATENT DOCUMENTS

| | | |
|---|---|---|
| JP | 2016054242 A | 4/2016 |
| WO | WO-2018211439 A1 | 11/2018 |

OTHER PUBLICATIONS

GB Search Report of the Intellectual Property Office issued in Application No. GB1900912.5, dated Jun. 25, 2019.
Japanese Office Action and Search Report for Japanese Application No. 109101915 dated Apr. 19, 2023.
Office Action issued in Corresponding Chinese Patent App. No. 202080010780.1 dated Jun. 24, 2024.
Examination Report for European Application No. 20 700 548.9 dated Nov. 17, 2023.

\* cited by examiner

APPARATUS FOR PROCESSING A WAFER, AND METHOD OF CONTROLLING SUCH AN APPARATUS

CROSS-REFERENCE TO RELATED APPLICATIONS

This application is a U.S. National Phase Application under 35 U.S.C. 371 of International Application No. PCT/EP2020/050076, filed on Jan. 3, 2020, which claims the benefit of Great Britain Patent Application No. GB 1900912.5, filed on Jan. 23, 2019. The entire disclosures of the applications referenced above are incorporated herein by reference.

FIELD OF THE INVENTION

The present invention relates to an apparatus for processing a wafer, and to a method of controlling such an apparatus.

BACKGROUND TO THE INVENTION

Semiconductor wafers may be subjected to various surface treatment processes, such as etching, cleaning, polishing and material deposition. To perform such processes, a wafer may be mounted on a rotatable chuck, so that various processes can be performed on a surface of the wafer.

For example, the surface of the wafer may be cleaned by applying a cleaning liquid (e.g. isopropyl alcohol or de-ionised water) to the surface of the wafer. The surface of the wafer may then be dried by spinning the wafer using the rotatable chuck and heating the wafer to cause evaporation of the cleaning liquid. Such a cleaning process is commonly referred to as a spin-clean process.

An example of an apparatus which may be used for cleaning the surface of a wafer is described in US2017/0345681A1, the contents of which are incorporated herein by reference.

The apparatus described in in US2017/0345681A1 includes a rotatable chuck on which a wafer is mountable, and a liquid dispenser for dispensing liquid on an upper surface of the wafer when the wafer is mounted on the rotatable chuck. The apparatus also includes an array of heating elements disposed below the wafer when the wafer is mounted in the rotatable chuck, and arranged to heat the wafer. After liquid is dispensed on the surface of the wafer, the array of heating elements are controlled to heat the wafer to cause evaporation of the liquid.

SUMMARY OF THE INVENTION

At its most general, the present invention provides an apparatus for processing a wafer, comprising light-emitting heating elements arranged to heat a wafer mounted in the apparatus, and one or more light sensors arranged to detect light emitted by the light-emitting heating elements. Thus, the apparatus of the present invention enables measurement of light emitted by the light-emitting heating elements.

Measurement of light emitted by the light-emitting heating elements may be useful for a number of different reasons. For example, the measurement may be used to identify degradation, deviation or failure in one or more of the light-emitting heating elements, or for achieving more accurate control of a light intensity distribution of the light emitted by the light-emitting heating elements. This may improve reproducibility between heating of different semiconductor wafers by the apparatus, or between different respective apparatuses, for example.

In particular, the inventors have found that the light emitted by the light-emitting heating elements may change over time, e.g. due to a fault or degradation of one or more of the light-emitting heating elements. This may lead to variations in heating conditions between different processing steps and from wafer to wafer. This may be problematic, for example because processes performed on semiconductor wafers can be highly sensitive to processing conditions such as temperature.

The apparatus of the present invention may serve to address this problem, because any changes in the light emitted by the light-emitting elements (e.g. change in intensity) may be detected by the one or more light sensors.

The present invention may also improve reproducibility of heating of wafers from apparatus to apparatus, by measuring and comparing light emitted by light-emitting heating elements in different apparatuses.

The apparatus of the present invention may also facilitate maintenance and troubleshooting of the apparatus. For example, the one or more light sensors may be used to detect changes over time in the light emitted by one or more of the light-emitting elements, which may result from degradation of one or more of the light-emitting elements. The one or more light sensors may be used to determine which element or group of elements is causing the change in the emitted light, so that the faulty element(s) can be replaced or repaired.

In some cases, it may be possible to compensate for a change in the illumination of the light-emitting heating elements, by adjusting the amount of power delivered to the light-emitting heating elements based on an output from the one or more sensors.

A conventional technique for monitoring an array of heating elements involves using a test wafer having an array of temperature sensors disposed thereon. The test wafer may be mounted over the array of heating elements, and the temperature at different points on the test wafer may be monitored using the array of temperature sensors. An algorithm may then be used to adjust power delivered to the heating elements until a desired temperature is achieved across the test wafer.

An advantage of the apparatus of the present invention over use of such a test wafer is that the one or more light sensors enable in situ detection of light emitted by the array of light-emitting heating elements. In contrast, the test wafer only enables indirect measurement of the output of the heating elements via measurement of the temperature of the test wafer, which may also be affected by various other variables and environmental factors. The present invention may therefore enable more accurate and rapid monitoring and control of the output of the array of light-emitting heating elements.

Accordingly, according to a first aspect of the present invention there is provided an apparatus for processing a wafer, the apparatus comprising: a rotatable chuck adapted to receive a wafer; a heating assembly comprising an array of light-emitting heating elements arranged to illuminate a wafer received by the rotatable chuck to heat the wafer; and one or more light sensors arranged to detect light emitted by the array of light-emitting heating elements.

As explained above, the one or more light sensors enable in situ detection of light emitted by the array of light-emitting elements. This may facilitate maintenance and troubleshooting of the apparatus, and/or may provide improved control of heating conditions for the wafer.

The apparatus according to the first aspect of the present invention may have any one, or, where compatible, any combination of the following optional features.

The term "rotatable chuck" (or rotary chuck) may merely mean a wafer holder that is designed to hold a wafer and rotate the wafer.

The rotatable chuck may be configured to rotate the wafer relative to an axis of rotation of the rotatable chuck that is substantially perpendicular to a surface of the wafer.

The rotatable chuck may be substantially circular when viewed from above.

The rotatable chuck may include a mechanism adapted to receive the wafer and hold the wafer securely in place relative to the chuck (e.g. a clamp, screw, vacuum holder, etc.).

The rotatable chuck may be adapted to receive a wafer of a predetermined size, e.g. a wafer having a diameter of 300 mm or 450 mm.

The rotatable chuck may include a motor for driving rotation of the chuck relative to the axis of rotation.

Alternatively, the rotatable chuck may be caused to rotate by an external driving means, for example via magnetic induction.

The heating assembly serves to heat a wafer mounted on the rotatable chuck. The heating assembly comprises an array of light-emitting heating elements arranged to illuminate a wafer received by the rotatable chuck.

Therefore, the light-emitting heating elements heat the wafer by radiative heating using light.

The term "array" may merely mean a plurality of light-emitting heating elements, and does not necessarily mean that the light-emitting heating elements are arranged in any particular order.

The array of light-emitting heating elements may be arranged to face towards the wafer when the wafer is received by the rotatable chuck.

The array of light-emitting heating elements may be arranged to face towards a first surface of the wafer, which is opposite a second surface of the wafer on which processing (e.g. cleaning, deposition of material, etc.) is performed.

The light-emitting heating elements may be disposed on a substantially plane surface (e.g. on a board, such as a circuit board).

The board may be arranged to be substantially parallel to the wafer when the wafer is received by the rotatable chuck.

The light-emitting heating elements may be substantially uniformly distributed over the plane surface, to illuminate the wafer in a uniform manner, which may result in uniform heating of the wafer.

The heating assembly may have a circular shape when viewed from above.

The array of light-emitting heating elements may be arranged to cover an area that is substantially the same as an area of the wafer, or an area that is within 10% of an area of the wafer.

All of the light-emitting heating elements may be of the same type (e.g. they may all have the same characteristics).

In general, a light-emitting heating element is an element (or part) that performs radiative heating using light.

The light emitted by the light-emitting heating element may be visible light.

The heating assembly may be mounted relative to the rotatable chuck such that it does not rotate together with the rotatable chuck when the rotatable chuck is rotated about the axis of rotation. In other words, the array of light-emitting heating elements may remain stationary when the rotatable chuck is rotated about the axis of rotation. This may facilitate providing electrical connections to the array of light-emitting heating elements.

Herein, a light-emitting heating element may refer to a light source which emits light at a wavelength suitable for heating a wafer. For example, a light-emitting heating element may emit light having a maximum intensity in a wavelength range from 380 nm to 650 nm.

In some embodiments, one or more of the light-emitting heating elements may be light emitting diodes (LEDs).

The light-emitting heating elements may be arranged in the heating assembly on concentric circles (concentric about a centre of the heating assembly).

In each concentric circle the heating elements may be bunched into different groups. In other words, the heating elements in a respective concentric circle may not be evenly distributed around that concentric circle.

Each of the different groups may contain the same number of heating elements, for example 16 heating elements.

The one or more light sensors are arranged to detect light emitted by the array of light-emitting heating elements. The one or more light sensors may thus output a signal which is related to the amount of light (or intensity of light) emitted by the array of light-emitting heating elements.

In this manner, the amount of light emitted by the array of light-emitting heating elements may be compared to a predetermined value, for example a target value, a previous measurement, or a reference value, to determine whether the array is operating at a desired level.

The one or more light sensors may be calibrated (e.g. relative to a reference light source). This may ensure reproducibility between different apparatuses.

Herein a light sensor may be a sensor capable of detecting light and of outputting a signal related to the amount of detected light. For example, a suitable light sensor may be a photodetector such as a photodiode.

The one or more light sensors may be arranged to detect light having a wavelength corresponding to a wavelength of the light emitted by the array of light-emitting heating elements.

The one or more light sensors may be at fixed positions in the apparatus relative to the array of light-emitting heating elements. This may enable reproducible measurements of the amount of light emitted by the array of light-emitting heating elements.

In use, the array of light-emitting heating elements may be controlled by supplying power to the array (e.g. via a power supply connected to the array). This may cause light to be emitted by the light-emitting heating elements.

A signal (or signals) obtained from the one or more light sensors may be used to determine whether the array of light-emitting heating elements is emitting light at a desired intensity, e.g. by comparing the signal to a previous measurement or to a reference signal or target value.

The signal from the one or more light sensors may serve to calibrate the array of light-emitting heating elements. For example, the power supplied to the array of light-emitting heating elements may be adjusted until the signal indicates that the desired intensity has been reached. This may also enable compensation for degradation of the light-emitting heating elements over time.

The signal from the one or more light sensors may be monitored over time to check for degradation of the array of light-emitting heating elements, or the appearance of a fault in the array.

In some embodiments, it may be possible to control individual groups of light-emitting heating elements in the array separately. In this manner, it may be possible to determine whether each group is emitting light at a desired intensity.

Similarly, in some embodiments it may be possible to control each individual light-emitting heating element separately, such that the amount of light emitted by each individual light-emitting heating element may be detected.

These embodiments may further facilitate maintenance of the apparatus, as they may enable identification of a single one or a group of light-emitting heating elements which is not functioning properly.

The one or more light sensors may comprise a light sensor (or more than one light sensor) positioned opposite to the array of light-emitting heating elements.

The light sensor positioned opposite to the array of light-emitting heating elements faces towards the array of light-emitting heating elements, either directly or at an angle.

In this manner, light emitted by the array of light-emitting heating elements may be emitted towards the one or more light sensors.

This may enable direct detection of light emitted by each of the light-emitting heating elements in the array.

This may improve the accuracy with which changes in the amount of light produced by the array of light-emitting heating elements can be detected. As a result, reproducibility of heating conditions across different apparatuses may also be improved.

A light sensor facing towards the array of light-emitting heating elements may mean that a light-receiving surface of the light sensor is directed towards the array, either directly or at an angle.

The light sensor positioned opposite to the array of light-emitting heating elements may be arranged to be on an opposite side of the wafer compared to the array of light-emitting heating elements when the wafer is received by the rotatable chuck.

In other words, the light sensor positioned opposite to the array of light-emitting heating elements may be disposed on an opposite side of the wafer compared to a side of the wafer that is illuminated by the array of light-emitting heating elements.

This may facilitate integration of the light sensor into an existing apparatus, as the structure of the rotatable chuck and the heating assembly need not be modified to accommodate the light sensor.

Additionally, this placement of the sensor opposite to the array of light-emitting heating elements may mean that the sensor may be located further away from the array of light-emitting heating elements. As a result, the light sensor may be able to detect light emitted from a larger number of light-emitting heating elements, such that fewer light sensors may be needed to measure light emitted by the entire array, or that only a single light sensor may be sufficient to detect light emitted from the entire array.

The light sensor positioned opposite to the array of light-emitting heating elements may be positioned on, and/or centred about, a rotational axis of the rotatable chuck.

The array of light-emitting heating elements may be disposed symmetrically about the rotational axis of the rotatable chuck. In this manner, the light sensor that is positioned on, or centred about, the rotational axis of the rotatable chuck may also be centred relative to the array of light-emitting heating elements.

This may facilitate detection of light emitted by all of the elements in the array of light-emitting heating elements. The light sensor positioned opposite to the array of light-emitting heating elements may be arranged at a predetermined fixed position relative to the array of light-emitting heating elements.

Where there is more than one light sensor positioned opposite to the array of light-emitting heating elements, each of the light sensors positioned opposite to the array of light-emitting heating elements may be arranged at a respectively predetermined fixed position relative to the array of light-emitting heating elements.

This may ensure reproducibility between measurements of the light emitted by the array of light-emitting heating elements.

The position of the light sensor being predetermined means that the distance between the light sensor and each of the light-emitting heating elements is also predetermined.

This may enable calculation of an intensity of the light emitted by the array of light-emitting heating elements based on an output signal from the one or more light sensors.

In some embodiments, the apparatus may comprise a cover that is arranged to prevent stray light from reaching the light sensor positioned opposite to the array of light-emitting heating elements.

This may avoid the light sensor positioned opposite to the array of light-emitting heating elements detecting stray light that is not emitted by the array of light-emitting heating elements.

As a result, accuracy of measurement of light emitted by the light-emitting heating elements may be improved.

The light sensor positioned opposite to the array of light-emitting heating elements may be positioned on, or attached to, an inside of the cover.

The cover may thus provide a convenient location for mounting the light sensor. This may avoid having to modify the structure of the rotatable chuck or the array of light-emitting heating elements to accommodate the one or more light sensors. This may facilitate integration of the one or more light sensors in an existing apparatus.

The cover may be mountable on a frame of a process chamber of the apparatus.

For example, the apparatus may include a process chamber in which the rotatable chuck and heating assembly are disposed. The process chamber may be a chamber in which various processes are performed on the wafer, e.g. etching, depositing of material, cleaning, etc. The cover may be arranged such that, when it is mounted on the frame of the process chamber, it prevents stray light from entering the chamber. Thus, when measuring light emitted by the array of light-emitting heating elements, the cover may be mounted on the frame of the process chamber. Once the measurement has been completed, the cover may be removed, e.g. to install other equipment in the process chamber.

The cover may include a set of alignment features to ensure that the light sensor positioned opposite to the array of light-emitting heating elements is located at a predetermined position with respect to the array of light-emitting heating elements. This may ensure that measurements of light emitted by the array of light-emitting heating elements are reproducible.

In some embodiments, the apparatus may comprise only a single light sensor positioned opposite to the array of light-emitting heating elements. This may simplify the apparatus, and/or facilitate detection and/or measurement of light emitted by the array of light-emitting heating elements, as only an output signal from the single light sensor need be analysed. In this manner, the single light sensor positioned opposite to the array of light-emitting heating elements may detect light emitted by the entire array of light-emitting heating elements.

In some embodiments, the one or more light sensors may comprise a light sensor arranged to detect light from the array of light-emitting heating elements that is reflected from the wafer when the wafer is received by the rotatable chuck.

Thus, the light sensor arranged to detect the reflected light may be arranged on the same side of the wafer as the array of light-emitting heating elements when the wafer is received by the rotatable chuck.

When a wafer is received by the rotatable chuck, light emitted by the array of light-emitting heating elements may be reflected by the wafer. Some, or all, of the reflected light may then be detected by the light sensor arranged to detect the reflected light.

In this manner, light emitted by the array of light-emitting elements may be detected and monitored when a wafer is received by the rotatable chuck.

This may enable the light emitted by the array of light-emitting heating elements to be monitored while the wafer is being processed. As a result, it may be possible to perform in situ compensation for degradation of the light-emitting heating elements while the wafer is being processed. This may serve to ensure that desired heating conditions are maintained during processing of the wafer.

The light sensor arranged to detect the reflected light may be positioned in a same plane as the array of light-emitting heating elements.

This may avoid the light sensor blocking light emitted by the light-emitting heating elements, whilst ensuring that the light sensor is appropriately positioned to receive the reflected light.

The light sensor arranged to detect the reflected light and the array of light-emitting heating elements may be integrated into a same board of the apparatus, for example a circuit board.

In this manner, both the sensor arranged to detect the reflected light and the array of light-emitting heating elements may be provided on a same board (or support). This may simplify construction of the apparatus.

For example, a plurality of the light sensors arranged to detect the reflected light may be distributed throughout the array of light-emitting heating elements. This may ensure that the sensors are capable of detecting reflected light from the entire array of light-emitting heating elements.

The board may be a circuit board.

In some cases, the board may comprise a heat-sink arranged to dissipate heat generated in the light-emitting heating elements.

As mentioned above, the apparatus may comprise a plurality of the light sensors arranged to detect light from the array of light-emitting heating elements that is reflected from the wafer when the wafer is received by the rotatable chuck.

This may enable light from more, or all, of the light light-emitting heating elements to be detected by the light sensors.

Above we have discussed embodiments where the one or more light sensors comprise one or more light sensors positioned opposite the array of light-emitting elements, and embodiments where the one or more light sensors comprise one or more light sensors arranged to detect light from the array of light-emitting heating elements that is reflected from the wafer. However, in some embodiments, the one or more light sensors may include both configurations of light sensors; i.e. the one or more light sensors may include one or more light sensors opposite the array of light-emitting heating elements and one or more light sensors arranged to detect light from the array of light-emitting heating elements that is reflected from the wafer.

In some embodiments, one or more of the light-emitting heating elements may be light emitting diodes (LEDs) arranged to emit light having a predetermined wavelength, or wavelengths in a predetermined wavelength range, and the one or more light sensors may be adapted to detect light having the predetermined wavelength, or wavelengths within the predetermined range.

Use of LEDs may be advantageous, as LEDs may be highly efficient and may generate relatively little wasted heat. The LEDs emit light at a wavelength or in a range of wavelengths that is suitable for heating a wafer. For example, the LEDS may emit light with a wavelength or wavelengths in the range of 380 nm to 650 nm. Other wavelength ranges may also be suitable.

The one or more light sensors are sensitive to light of the wavelength emitted by the light-emitting heating elements. This may ensure accurate detection of light emitted by the array of light-emitting heating elements.

In some cases, the one or more light sensors may only be sensitive to wavelengths in the predetermined wavelength range. In this manner, stray light having a wavelength outside the predetermined wavelength range may not be detected by the light sensors, which may improve the accuracy with which light emitted by the array of light-emitting heating elements can be detected.

The apparatus may include one or more optical filters arranged to selectively transmit light having the predetermined wavelength, or wavelengths within the predetermined range of wavelengths. For example, the filter may be a low-pass filter, a high-pass filter, or a band-pass filter.

The one or more optical filers may be arranged such that the one or more light sensors only receive light that has passed through the one or more optical filters.

In this manner, stray light having a wavelength that is outside the predetermined wavelength range may not be detected by the light sensors. This may improve the accuracy with which light emitted by the array of light-emitting elements may be detected.

The one or more filters may be integrated with, or attached to, the one or more light sensors, or may be provided separately to the one or more light sensors.

The apparatus may further comprise a controller configured to control power supplied to the array of light-emitting heating elements, and to receive a measurement output of the one or more light sensors.

The controller may be a computing device having software installed thereon for controlling the power supplied to the array of light-emitting heating elements and receiving a measurement output of the one or more light sensors.

Such a controller may facilitate monitoring of light emitted by the light-emitting heating elements, e.g. by recording measurements from the one or more light sensors.

Such measurements may then be used, for example, to determine whether there is any degradation of the array of light-emitting heating elements over time.

The controller may be connected, via a communication interface (e.g. USB, Ethernet, etc.), to a power supply which supplies power to the array of light-emitting heating elements. The controller may be configured to send commands to the power supply, to control the amount of power supplied by the power supply to the array of light-emitting heating elements. Similarly, the controller may be connected, via a communication interface (e.g. USB, Ethernet, etc.), to the one or more light sensors to receive the measurement output from the one or more light sensors.

The controller may be configured to control the apparatus on the basis of the measurement output of the one or more light sensors.

For example, the controller may be configured to control the power supplied to the array of light-emitting heating elements until the measurement output indicates that a desired intensity of light emitted by the array of light-emitting heating elements is reached. This may be achieved, for example, by comparing the measurement output, or information derived from the measurement output, to a reference value that corresponds to the desired intensity. In this manner, the controller may perform an automated calibration of the array of light-emitting heating elements.

The controller may be configured to compare a measurement output of the one or more light sensors, or information derived from the measurement output, to a reference value and, based on the comparison: determine information relating to an operating condition of one or more of the light-emitting heating elements of the array of light-emitting heating elements; and/or adjust the power supplied to one or more of the light-emitting heating elements of the array of light-emitting heating elements.

The reference value may be, for example, a target/desired value, a previous measurement value from the same one or more light sensors, or a separate measurement value obtained for one or more reference light-emitting heating elements.

Information relating to an operating condition of one or more of the light-emitting heating elements may, for example, be an identification that the light intensity from a group, or all, of the light-emitting heating elements is less than expected, and that therefore one or more of the light-emitting heating elements may not be operating as expected.

Alternatively, this information may be identification of a particular light-emitting heating element that is not functioning properly, due to e.g. degradation or single fault. In this manner, the controller may determine whether one or more of the light-emitting heating elements are functioning properly, or whether it is suffering from a degradation or fault. For example, if the measurement output, or information derived from the measurement output, matches the reference value, then the controller may determine that the one or more light-emitting elements are functioning properly. If the measurement output, or information derived from the measurement output, does not match (e.g. it is lower than) the reference value, then the controller may determine that the one or more light-emitting elements are not functioning properly, e.g. they have degraded or are faulty.

The controller may be configured to notify a user of the determined operating condition of the one or more light-emitting heating elements. In this manner, the user may be made aware of degradation of, or a fault with, the light-emitting heating elements, so that the user may carry out appropriate maintenance of the device.

The controller may be configured to store, in a memory, a reference value corresponding to a measurement output when a predetermined power level is supplied to the one or more of the light-emitting heating elements. In this manner, the controller may test the operating condition of the one or more light-emitting heating elements by applying the predetermined power level to the one or more light-emitting heating elements and comparing the measurement output, or information derived from the measurement output, to the reference value. The controller may be configured to store reference values for different sets of the one or more light-emitting heating elements. In this manner, the controller may determine the operating condition of the different sets of the one or more light-emitting heating elements.

The controller may adjust the power supplied to one or more of the light-emitting heating elements of the array of light-emitting heating elements based on the comparison. For example, where it is determined that a light-intensity from one or a group of light-emitting heating elements is less than the reference value, the controller may increase power supplied to the one or group of light-emitting heating elements to increase the light-intensity to the reference value. This adjustment of the power may be performed independently of, or following, the determination of the operating condition.

In this manner, the controller may compensate for degradation of, or a fault with, the one or more light-emitting heating elements. This may serve to ensure that desired heating conditions (e.g. illumination intensity) are used when processing a wafer, which may in turn improve reproducibility of the processing between wafers and apparatuses.

The array of light-emitting heating elements may be composed of a plurality of individually controllable groups of light-emitting heating elements, and the controller may be configured to individually control power supplied to each of the plurality of groups of light-emitting heating elements.

In this manner, each of the groups of light-emitting heating elements may be individually activated by the controller by supplying power to that group. This may reduce a complexity of the apparatus relative to controlling each of the light-emitting heating elements individually.

A group of light-emitting heating elements may comprise one or more of the light-emitting heating elements in the array of light-emitting heating elements.

Each group of light-emitting heating elements may be arranged to heat a different zone of the wafer when the wafer is received by the rotatable chuck.

The plurality of groups of light-emitting heating elements may be arranged concentrically about the axis of rotation of the rotatable chuck, such that each group occupies a respective radial position. In this manner, different radial zones of the wafer may be heated by activating different groups of light-emitting heating elements.

The controller may be further configured to: receive a measurement output from the one or more light sensors that is indicative of an illumination intensity of one of the plurality of groups of light-emitting heating elements; compare the measurement output, or information derived from the measurement output, for that group of light-emitting heating elements with a reference value for that group; and based on the comparison: determine information relating to an operating condition of that group of light-emitting heating elements; and/or control power supplied to that group of light-emitting heating elements.

In this manner, the controller may determine an operating condition for a particular group of light-emitting heating elements. The controller may perform this process for each group of light-emitting heating elements, so that an operating condition may be determined for each group of light-emitting heating elements. This may facilitate troubleshooting and maintenance of the apparatus, as it may facilitate identification of a group of light-emitting heating elements which is not functioning properly.

To obtain the measurement output indicative of an illumination intensity of one of the plurality of groups of light-emitting heating elements, the controller may be configured to control power supplied to the group of light-emitting heating elements to cause the group of light-emitting heating elements to emit light (for example to control only that group of light-emitting elements to emit light, and not the other light-emitting heating elements in the array).

The controller may further be configured to, based on the determined operating condition for the group of light-emitting heating elements, adjust the power supplied to the group of light-emitting elements. In this manner, each of the groups of light-emitting heating elements may be individually calibrated.

The controller may be configured to store, in a memory, a reference value for each of the plurality of groups of light-emitting heating elements. A reference value for a group of light-emitting heating elements may be associated with a predetermined power level for that group of light-emitting heating elements. Thus, to determine an operating condition of a group of light-emitting heating elements, the controller may adjust the power level supplied to that group to the predetermined power level for that group.

The reference value may be a previous measurement output obtained using the one or more light sensors.

The apparatus may comprise further components, as required for performing processes on the wafer. For example, the apparatus may further comprise a liquid dispenser arranged to dispense liquid (e.g. cleaning liquid) onto a surface of the wafer. The liquid dispenser may be arranged to dispense liquid on a surface of the wafer that is opposite a surface of the wafer that faces the array of light-emitting heating elements.

The liquid dispenser may be movable to dispense liquid at different positions on the surface of the wafer. Thus, during a cleaning process, liquid may be dispensed on the surface of a wafer received in the rotatable chuck. The wafer may then be rotated with the rotatable chuck to remove the liquid from the surface of the wafer. Remaining liquid may then be evaporated, by heating the wafer with the array of light-emitting heating elements.

The apparatus may further comprise a transparent plate (e.g. made of quartz or sapphire) arranged to be between the array of light-emitting heating elements and the wafer when the wafer is received in the rotatable chuck. The transparent plate may be transparent to light emitted by the light-emitting heating elements. The transparent plate may serve to protect the array of light-emitting heating elements from processes that are being performed on a surface of the wafer.

The apparatus may be a cleaning apparatus for cleaning the wafer. More particularly, the apparatus may be a spin-clean apparatus for spin-cleaning the wafer The wafer may be a semiconductor wafer.

According to a second aspect of the invention, there is provided a method of controlling the apparatus according to the first aspect of the invention. The method of the second aspect of the invention may include features discussed above in relation to the first aspect of the invention; these features are therefore not repeated.

The method may comprise: supplying power to the array of light-emitting heating elements; receiving a measurement output from the one or more light sensors; comparing the measurement output, or information derived from the measurement output, to a reference value; and based on the comparison: determining information relating to an operating condition of the array of light-emitting heating elements, and/or controlling power supplied to the array of light-emitting heating elements.

The method may further include, based on the determined operating condition, adjusting the power supplied to the array of light-emitting heating elements.

The method may further comprise selectively supplying power to one or more of the light-emitting heating elements, and determining information relating to an operating condition of the one or more of the light-emitting heating elements.

BRIEF DESCRIPTION OF THE DRAWINGS

Embodiments of the invention are discussed below with reference to the accompanying drawings, in which.

DETAILED DESCRIPTION; FURTHER OPTIONS AND PREFERENCES

Figure 1A:
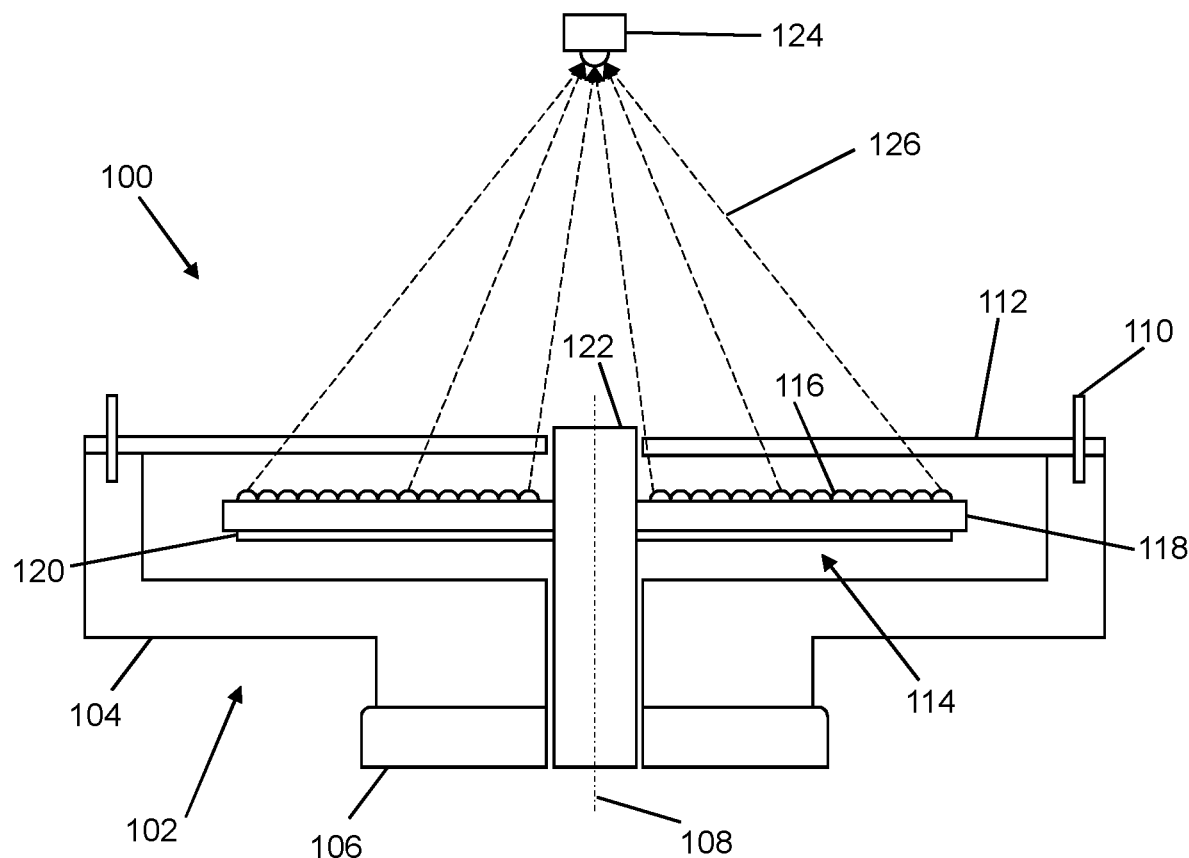
FIG. 1a is a schematic cross-sectional view of an apparatus according to a first embodiment of the invention.
Figure 1B:
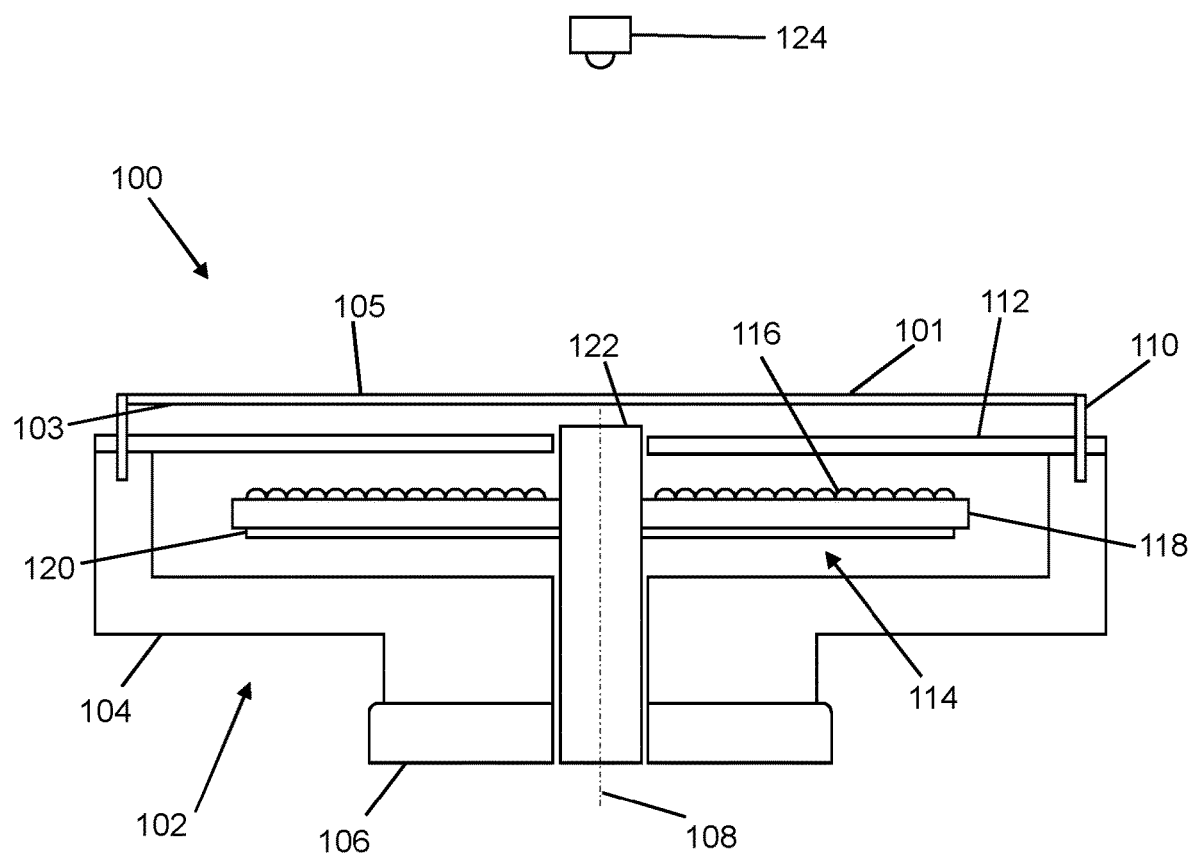
FIG. 1b is a schematic cross-sectional view of the first embodiment of the invention, where a wafer is mounted in the apparatus.

FIGS. 1a and 1b show schematic cross-sectional diagrams of an apparatus 100 for processing a wafer according to a first embodiment of the invention. In FIG. 1a, no wafer is mounted in the apparatus. In FIG. 1b, a wafer 101 is mounted in the apparatus 100.

The apparatus 100 includes a rotatable chuck 102 which is adapted to receive a wafer. The rotatable chuck 102 includes a chuck body 104 which is rotatably mounted on a base 106. The chuck body 104 is rotatable relative to the base 106 about an axis of rotation indicated by reference numeral 108. Rotation of the chuck body 104 relative to the base 106 may be driven, for example, by a motor (not shown), which may itself be controlled by a controller. The chuck body 104 includes a set of gripping pins 110 which are adapted to receive a wafer and hold the wafer securely in place. In this manner, when a wafer is mounted on the rotatable chuck 102 via the gripping pins 110, the wafer may be rotated by rotating the chuck body 104 relative to the base 106. In the configuration shown in FIG. 1b, the gripping pins 110 exert a gripping force to hold the wafer 101 in place. However, other suitable mechanisms may be used for holding the wafer 101 in place instead (e.g. clamp, screws, suction holder, etc.).

The rotatable chuck 102 further includes a transparent plate 112, e.g. made of quartz or sapphire, mounted on the chuck body 104. The transparent plate 112 is secured to the chuck body 104, such that it rotates with the chuck body 104 relative to the base 106. As shown in FIG. 1b, the transparent plate 112 is arranged such that it is substantially parallel to the wafer 101 when the wafer 101 is mounted in the rotatable chuck 102.

The apparatus 100 further comprises a heating assembly 114. The heating assembly 114 comprises an array of LEDs 116 arranged to illuminate a wafer mounted in the rotatable chuck 102. The LEDs 114 serve as light-emitting heating elements for heating a wafer (e.g. wafer 101) received by the rotatable chuck. In this example, the LEDs are arranged to emit light in a wavelength range from 380 nm to 650 nm. For example, the LEDs 116 may emit light having a maximum intensity in the wavelength range from 380 nm to 650 nm. The inventors have found that this wavelength range is suitable for heating a semiconductor wafer. The transparent plate 112 is arranged such that it is substantially transparent to wavelengths emitted by the LEDs 116, i.e. all or a majority of light emitted by the LEDs 116 is transmitted by the transparent plate 112.

The heating assembly 114 further comprises a plate 118. The array of LEDs 116 is mounted on an upper surface of the plate 118, which acts as a heat-sink for the array of LEDs 116 to dissipate heat generated by the LEDs 116. For example, the plate 118 may be made of a metal such as aluminium. A circuit board 120 including driving circuitry (not shown) for the LEDs 116 is provided on a lower surface of the plate 118. Interconnections between the array of LEDs 116 and the driving circuitry on the circuit board are made through the plate 118. The plate 118 is mounted on a stationary post 122. The stationary post 122 is not connected to the chuck body 104 such that it does not rotate with the chuck body 104. The plate 118 is substantially parallel to the transparent plate 112.

The array of LEDs 116 is arranged to face towards the wafer 101 when the wafer is mounted in the rotatable chuck 102. As shown in FIG. 1*b*, when the wafer 101 is mounted in the rotatable chuck 102, the transparent plate 112 is located between the array of LEDs 116 and the wafer 101. Thus, light emitted by the array of LEDs 116 may be transmitted by the transparent plate 112 and impinge on the wafer 101 to heat the wafer 101. The transparent plate 112 may serve to protect the array of LEDs 116 from processes that are performed on the wafer 101 when the wafer is mounted in the rotatable chuck 102.

The array of LEDs 116 is arranged to illuminate a first surface 103 of the wafer 101, which is opposite a second surface 105 of the wafer 101. The second surface 105 of the wafer 101 is exposed, such that processes (e.g. etching, depositing of material, cleaning) may be performed on the second surface 105 of the wafer 101. The array of LEDs 116 may be disposed substantially symmetrically about the axis of rotation 108 of the rotatable chuck 102. In this manner, the array of LEDs 116 may illuminate the wafer substantially symmetrically about the axis of rotation 108.

The apparatus 100 further includes a light sensor 124 arranged to detect light emitted by the array of LEDs 116. The light sensor 124 may be a photodiode or other suitable light sensor, and is sensitive to light emitted by the LEDs 116. The light sensor 124 may include an optical bandpass filter which is arranged to selectively transmit a range of wavelengths corresponding to, or including, the wavelengths emitted by the LEDs 116. The light sensor 124 is positioned opposite to the array of LEDs 116 and faces towards the array of LEDs 116, i.e. a light-receiving area of the light sensor 124 is directed towards the array of LEDs 116. The light sensor 124 is centred about the axis of rotation 108 of the rotatable chuck 102. Thus, it may be substantially centred with respect to the array of LEDs 116. In this embodiment only a single light sensor 124 is provided, and the light sensor 124 is arranged to sense light from all of the LEDs 116 in the array of LEDs 116.

The light sensor 124 is at a fixed position relative to the array of LEDs 116. This may improve reproducibility of detection of light from the LEDs 116. A distance between the light sensor 124 and the array of LEDs 116 may be set to enable good detection of light from all of the LEDs 116 in the array of LEDs 116, e.g. taking into account a brightness of the LEDs 116, a sensitivity of the light sensor 124, and angles of incidence from the LEDs to the light sensor 124.

Arrows in FIG. 1*a* indicated by reference numeral 126 illustrate light emitted by the LEDs which is incident on the light sensor 124. The light sensor 124 enables direct detection of light emitted by the LEDs 116, so that a performance of the array of LEDs 116 may be directly monitored.

The light sensor 124 may output a signal which is related to (e.g. proportional to) an amount of light detected. In this manner, it may be possible to, based on a measurement output from the light sensor 124, estimate a light intensity produced by the array of LEDs 116. In practice, it may be difficult to estimate an absolute value of the light intensity of the LEDs 116, due to the variations in angle of incidence across the array of LEDs 116. However, the light sensor 124 may enable relative values of light emitted by the LEDs 116 to be measured and tracked over time. For example, the output signal from the light sensor 124 may be recorded and monitored, to determine whether there is any change in the amount of light emitted by the array of LEDs over time, e.g. due to a degradation of the LEDs 116 or a fault in the array.

As shown in FIG. 1*b*, when the wafer 101 is mounted in the rotatable chuck 102, the wafer 101 is disposed between the light sensor 124 and the array of LEDs 116. As a result, light from the LEDs 116 is prevented from reaching the light sensor 124 by the wafer 101. Thus, in use, light emitted by the array of LEDs 116 may be measured prior to mounting a wafer in the rotatable chuck 102, e.g. to assess a performance of the array of LEDs and/or calibrate the array of LEDs 116. Following the measurement, the wafer 101 may be mounted in the rotatable chuck 102 to be processed.

The LEDs 116 may be arranged in a plurality of individually controllable groups of LEDs 116. Power may be supplied independently to each of the plurality of groups of LEDs 116, e.g. via circuitry on the circuit board 120, such that each of the groups of LEDs 116 may be independently controlled (e.g. switched on or off). Each group of LEDs 116 may comprise one or more of the LEDs 116 in the array. Each group of LEDs 116 may be arranged to heat a particular zone of the wafer 101, such that different zones of the wafer 101 may be controllably heated. The plurality of groups of LEDs 116 may be arranged concentrically about the axis of rotation 108 of the rotatable chuck 102, such that each group occupies a respective radial position. In this manner, different radial zones of the wafer 101 may be heated by activating different groups of LEDs 116.

Each of the groups of LEDs 116 may be individually activated in order to obtain a measurement of light emitted by that group using the light sensor 124. In this manner, it may be possible to determine whether each of the groups of LEDs 116 is functioning correctly.

In order to detect light from a single LED 116, or single group of LEDs 116, power may be supplied to only that single LED 116 or group of LEDs 116, so that light sensor 124 detects only light from that single LED 116 or group of LEDs 116.

The apparatus 100 may further include a controller (not shown) to control power supplied to the array of LEDs 116, and to receive measurement outputs (e.g. an output signal) from the light sensor 124.

The controller may be any suitable computing device having software installed thereon for performing the required functions. For example, the controller may be connected to the circuit board 120 via a communication interface (e.g. USB, Ethernet, etc.) to control the amount of power supplied to the array of LEDs 116. Similarly, the controller may be connected to the light sensor 124 via a communication interface to receive measurement outputs from the light sensor 124. The controller may include a memory in which various control parameters (e.g. power levels) for the array of LEDs 116 is stored. The controller may also store measurement data received from the light sensor 124.

The controller may be configured to automatically control the power supplied to the array of LEDs 116 based on the measurement output received from the light sensor 124. For example, the controller may adjust the power supplied to the array of LEDs 116 until the measurement output indicates that a desired illumination is produced by the LEDs 116 (e.g. by comparing the measurement output to a reference value). Where the array of LEDs 116 includes a plurality of individually controllable groups of LEDs 116, the controller may automatically adjust the power supplied to each of the groups of LEDs 116 so that a desired output is obtained for each group.

The controller may be configured to automatically determine an operating condition of the array of LEDs 116, e.g. whether the array of LEDs 116 is functioning properly or not. To do this, the controller may store a reference value for the array of LEDs 116 in its memory. The reference value may correspond to a measurement output from the light sensor 124 when a predetermined power level is supplied to the array of LEDs 116, for example as measured in a previous measurement. Then, the controller may supply the predetermined power level to the array of LEDs 116, and compare the measurement output from the light sensor 124 to the reference value. If the measurement output matches the reference value, then the controller may determine that the array of LEDs 116 is functioning correctly. If the measurement output is different from (e.g. lower than) the reference value, then the controller may determine that the array of LEDs 116 is not working properly. The controller may notify a user when such a determination is made, so that the user may investigate the problem further and carry out any appropriate maintenance. Similarly, the controller may store a reference value for each of the plurality of groups of LEDs 116, such that an operating condition of each of the groups can be determined. The controller may further be configured to adjust the power supplied to the array of LEDs 116 based on the measurement or on the determined operating condition, e.g. to compensate for a degradation in the LEDs 116.

Figure 2:
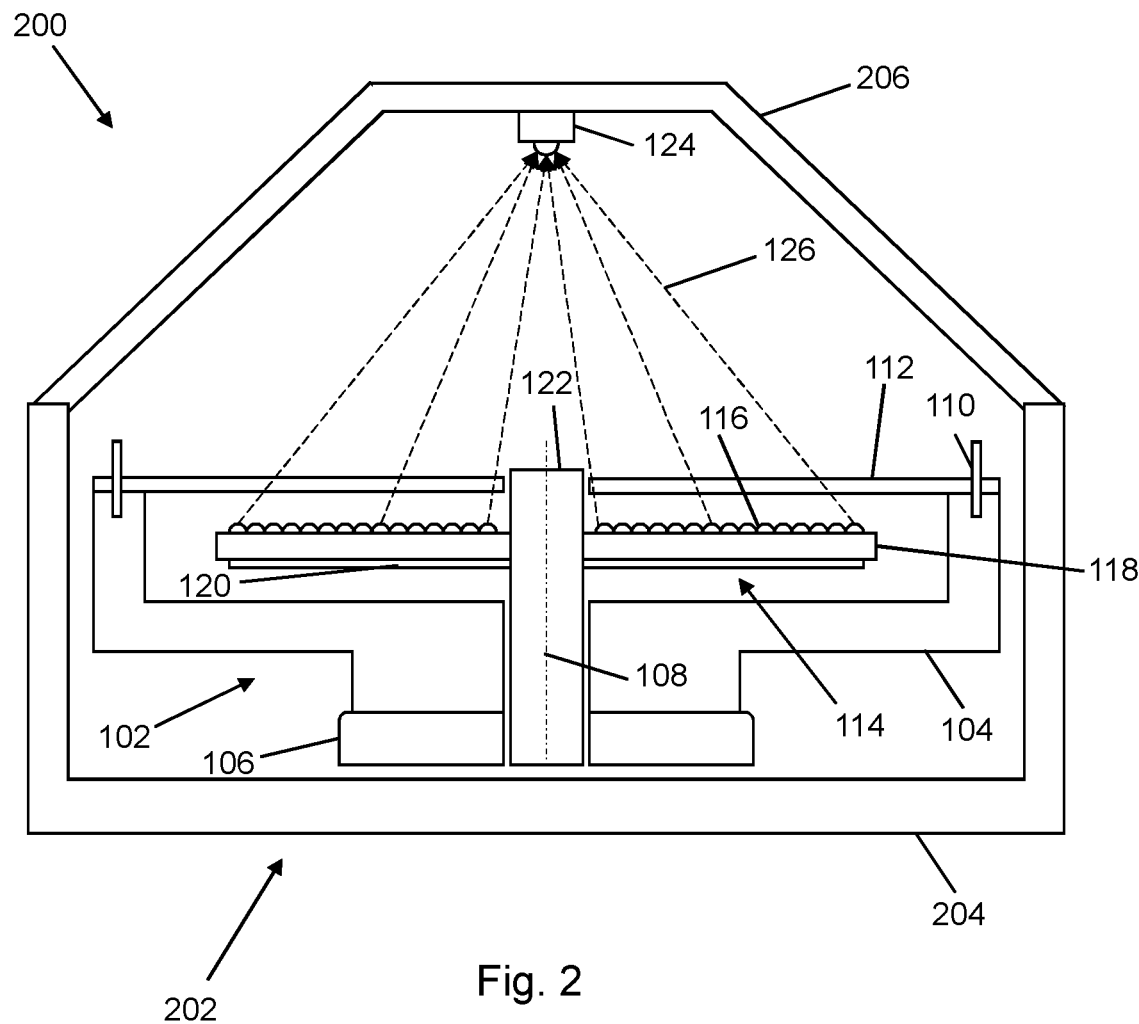
FIG. 2 is a schematic cross-sectional view of an apparatus according to a second embodiment of the invention.

FIG. 2 shows a schematic cross-sectional diagram of an apparatus 200 for processing a wafer that is a second embodiment of the invention. The apparatus 200 includes all of the features described in relation to apparatus 100, such as a rotatable chuck, heating assembly and light sensor. Features of apparatus 200 which correspond to those described in relation to apparatus 100 are indicated in FIG. 2 with the same reference numeral as in FIG. 1, and are not described again.

In addition to the features described in relation to apparatus 100, apparatus 200 includes a process chamber 202. As shown in FIG. 2, the rotatable chuck 102, base 106, heating assembly 114 and light sensor 124 are disposed within the process chamber 202. The process chamber 202 may be a chamber suitable for processing a wafer. For example, it may be able to control the atmosphere within the process chamber 202 (e.g. its pressure and composition), to provide favourable conditions for processing the wafer. The process chamber 202 includes a frame 204 in which the rotatable chuck 102, base 106 and heating assembly 114 (together with the post 122) are mounted. The process chamber 202 further includes a cover 206 in which the light sensor 124 is mounted. The light sensor 124 is mounted in the cover 206 such that it faces towards the array of LEDs 116 and is centred about the axis of rotation 108 of the rotatable chuck. The cover 206 is mounted on the frame 204 of the process chamber 202, and serves to prevent stray light from entering the process chamber 202 from outside. In this manner, the only light detected by the light sensor 124 may be light emitted by the array of LEDs 116. This may improve the accuracy with which light emitted by the array of LEDs 116 may be measured.

The cover 206 is arranged to hold the light sensor 124 in a predetermined fixed position relative to the array of LEDs 116, such that the position of the light sensor 124 relative to the array of LEDs 116 may be accurately known during measurements. This may ensure reproducibility of measurements.

In some cases, the cover 206 may be removably mountable on the frame 204 of the process chamber 202. In this manner, the cover 206 may be removed from the frame 204, e.g. in order to install a wafer in the rotatable chuck 102 for processing. Once the wafer is installed in the rotatable chuck 102, the cover 206 may be mounted on the frame 204 to close the process chamber 202. The cover 206 and frame 204 may comprise engageable alignment features, for positioning the cover 206 relative to the frame 204. This may ensure that the light sensor 124 is at a predetermined location when the cover 206 is mounted on the frame 204. A suitable alignment feature may be a corresponding protrusion and recess or notch, for example. The set-up of apparatus 200 may facilitate integration of light sensor 124 in an existing apparatus. Indeed, only the cover 206 of the process chamber 202 need be modified to accommodate the presence of the light sensor 124.

Figure 3:
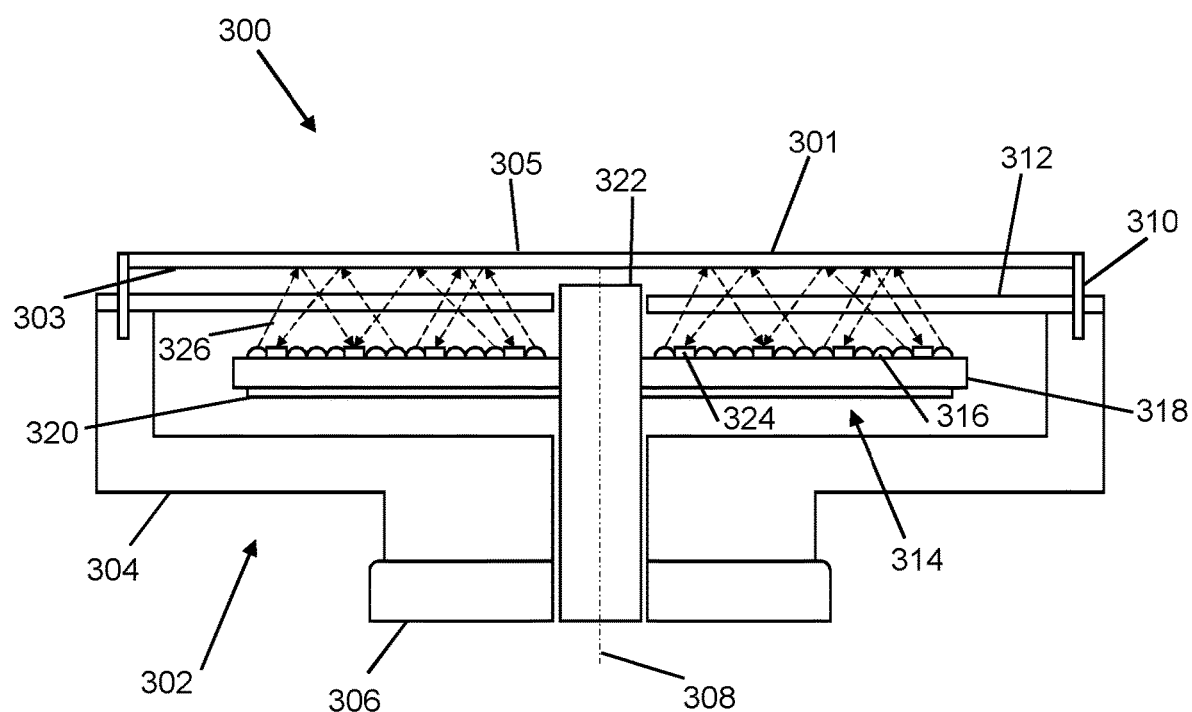
FIG. 3 is a schematic cross-sectional view of an apparatus according to a third embodiment of the invention

FIG. 3 shows a schematic cross-sectional diagram of an apparatus 300 for processing a wafer that is a third embodiment of the invention. The apparatus 300 includes a rotatable chuck 302 adapted to receive a wafer 301. The rotatable chuck 302 includes a chuck body 304 which is rotatably mounted on a base 306, and which is rotatable about an axis of rotation indicated by reference numeral 308. The chuck body 304 includes a set of gripping pins 310 which are adapted to receive a wafer and hold the wafer securely in place. In the example shown in FIG. 3, a wafer 301 is shown mounted in the rotatable chuck 302. The rotatable chuck 302 further includes a transparent plate 312, e.g. made of quartz or sapphire, mounted on the chuck body 304. The transparent plate 312 is arranged such that it is substantially parallel to the wafer 301 when the wafer is mounted in the rotatable chuck 302. The rotatable chuck 302 and its components may function in a similar manner to the rotatable chuck 102 of apparatus 100 described above, and the description of components of the apparatus 100 above may be applied to the corresponding components of this apparatus 300.

The apparatus 300 further includes a heating assembly 314. The heating assembly 314 comprises an array of LEDs 316 arranged to illuminate the wafer 301 when it is mounted in the rotatable chuck 302. The LEDs 316 serve as light-emitting heating elements for heating the wafer 301. In this example, the LEDs arranged to emit light in a wavelength range from 380 nm to 650 nm. For example, the LEDs 316 may emit light having a maximum intensity in the wavelength range from 380 nm to 650 nm. The transparent plate 312 is arranged such that it is transparent to wavelengths emitted by the LEDs 316, i.e. light emitted by the LEDs 316 is transmitted by the transparent plate 312.

The heating assembly 314 further comprises a plate 318. The LEDs 316 are mounted on an upper surface of the plate 318. The plate 318 acts as a heat-sink for the array of LEDs 316 to dissipate heat generated by the LEDs 316. For example, the plate 318 may be made of a metal such as aluminium. A circuit board 320 including driving circuitry (not shown) for the LEDs 316 is provided on a lower surface of the plate 118. Interconnections between the array of LEDs 316 and the driving circuitry on the circuit board are made through the plate 318. The plate 318 is mounted on a stationary post 322. The stationary post 322 is not connected to the chuck body 304 such that it does not rotate with the chuck body 304. The plate 318 is substantially parallel to the transparent plate 312.

The array of LEDs 316 is arranged to illuminate a first surface 303 of the wafer 301, which is opposite a second surface 305 of the wafer 301. The second surface 305 of the wafer 301 is exposed, such that processes (e.g. etching, depositing of material, cleaning) may be performed on the second surface 305 of the wafer 301. The array of LEDs 316 is disposed substantially symmetrically about the axis of rotation 308 of the rotatable chuck 302. In this manner, the array of LEDs 316 may illuminate the wafer substantially symmetrically about the axis of rotation 308.

The heating assembly 314 may function in a similar manner to the heating assembly 114 of apparatus 100 described above. For example, the array of LEDs 316 may be arranged in a group of individually controllable LEDs 316, as discussed above in relation to apparatus 100.

The apparatus 300 further includes a set of light sensors 324. The set of light sensors 324 are disposed on the upper surface of the plate 318, i.e. on the same surface as the array of LEDs 316. The set of light sensors 324 are distributed throughout the array, for example in a substantially uniform manner (e.g. at regular intervals). The light sensors 324 may be photodiodes or some other suitable light sensor, and are sensitive to light emitted by the LEDs 316. The light sensors 324 may include optical bandpass filters which are arranged to selectively transmit a range of wavelengths corresponding to the wavelengths emitted by the LEDs 316.

The light sensors 324 are arranged to face in the same direction as the LEDs 316. In this manner, the light sensors may detect light from the LEDs 316 that is reflected off the second surface 305 of the wafer 301 when the wafer 301 is mounted in the rotatable chuck 302. This is illustrated by arrows 326 in FIG. 3, which represent light emitted by the LEDs 316, which is reflected by the wafer 301 and then detected by the light sensors 324. As the light sensors are distributed throughout the array of LEDs 316, it may be possible to detect light emitted by all of the LEDs 316 with the light sensors 324. Each light sensor 324 may output a measurement signal that is related to (e.g. proportional to) an amount of light detected by that light sensor 324. The circuit board 320 may include reading circuitry for obtaining measurement signals from each of the light sensors 324. Interconnections between the light sensors 324 and the circuit board 320 may be formed through the plate 318.

Thus, apparatus 300 enables light from the LEDs 316 that is reflected from the wafer 301 to be measured. This may enable real-time monitoring of the performance of the LEDs 316 while a wafer is mounted in the rotatable chuck, e.g. while the wafer is being processed. This may enable real-time adjustment of the power supplied to the array of LEDs 316, to ensure that desired heating conditions are maintained throughout processing of the wafer.

The apparatus 300 may further include a controller (not shown) for controlling power supplied to the LEDs 316, and to receive measurement outputs (e.g. output signals) from the light sensors 324. The controller may be any suitable computing device having software installed thereon for performing the required functions. For example, the controller may be connected to the circuit board 320 via a communication interface (e.g. USB, Ethernet, etc.) to control the amount of power supplied to the array of LEDs 116, and to receive measurement outputs from the light sensors 324. The controller may include a memory in which various control parameters (e.g. power levels) for the array of LEDs 116 is stored. The controller may also store measurement data received from the light sensors 324.

The controller may be configured to perform functions similar to those described above in relation to the controller of apparatus 100. For example, the controller may be configured to automatically control the power supplied to the LEDs 316 or to a group of LEDs 316 based on measurement outputs received from the light sensors 324. In this manner, the controller may enable automated control of the array of LEDs 316 based on measurements by the light sensors 324, while the wafer 301 is mounted in the rotatable chuck 302. The controller may also be configured to determine an operating condition of the array of LEDs 316, or of a group of LEDs 316. Depending on the determined operating condition, the controller may be configured to notify a user of the operating condition, so that the user may perform appropriate maintenance procedures.

The apparatuses of all the embodiments described above may include further components arranged to process a wafer mounted in the rotatable chuck. For example, the apparatus may include a liquid dispenser arranged to dispense a liquid onto an upper surface of the wafer (i.e. a surface of the wafer opposite a surface of the wafer that is illuminated by the array of LEDs).

The apparatus may be an apparatus for cleaning the wafer, for example a spin-clean apparatus for spin-cleaning the wafer.

The wafer may be a semiconductor wafer.

Figure 4:
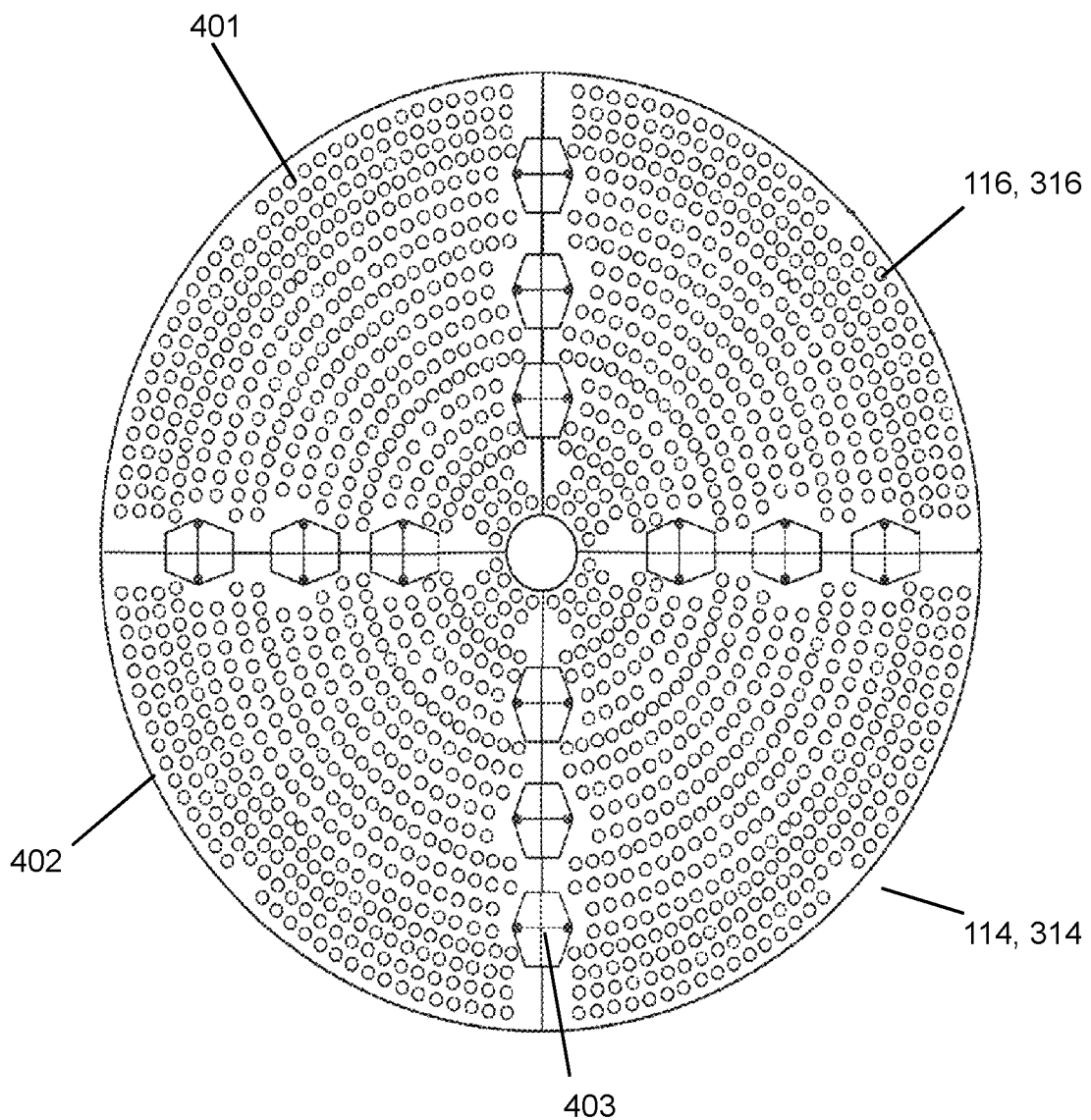
FIG. 4 is an example of a heating assembly that can be used in embodiments of the present invention.

An example configuration of the heating assembly 114, 314 in some embodiments of the present invention is illustrated in FIG. 4.

As shown in FIG. 4, the LEDs 116, 316 are arranged on concentric rings around a centre of the heating assembly 114, 314. The arrangement of the LEDs 116, 316 is rotationally symmetric around the centre of the heating assembly 114, 314. Within a given concentric ring, the LEDs 116, 316 are bunched into groups 401, for example with 16 LEDs 116, 316 in each group 401. In other words, the LEDs 116, 316 in a given concentric ring are not evenly distributed around the concentric ring.

As discussed above, the power to each of the groups 401 of LEDs 116, 316 may be independently controlled.

In this example there are 20 concentric rings of LEDs 116, 316, but of course in other embodiments the number of concentric rings may be different.

In FIG. 4, the heating assembly 114, 314 is divided into four quadrants 402, which are joined together by connectors 403.

Each LED may have a power consumption of 10 W and provide a power of 3 W.

Of course, the heating assembly 114, 314 may be different to that illustrated in FIG. 4. In particular, the arrangement of the LEDs in the heating assembly is not essential to the present invention.

The invention claimed is:

1. An apparatus for processing a wafer, the apparatus comprising:
    a rotatable chuck adapted to receive the wafer;
    a heating assembly comprising an array of light-emitting heating elements arranged to illuminate the wafer received by the rotatable chuck to heat the wafer, wherein the array of light-emitting heating elements is arranged to illuminate a first surface of the wafer when the wafer is received by the rotatable chuck, wherein the first surface is on an opposite side of the wafer than a second surface of the wafer, and wherein the second surface is exposed for processing when the wafer is received by the rotatable chuck;
a liquid dispenser arranged to dispense a liquid onto the second surface of the wafer; and
one or more light sensors arranged to detect light emitted by the array of light-emitting heating elements and configured to output a signal which is related to intensity of light emitted by the array of light-emitting heating elements,
wherein
the one or more light sensors comprise a light sensor positioned opposite to the array of light-emitting heating elements and arranged to be on an opposite side of the wafer compared to the array of light-emitting heating elements when the wafer is received by the rotatable chuck: or
the one or more light sensors comprise a light sensor arranged to detect light from the array of light-emitting heating elements that is reflected from the wafer when the wafer is received by the rotatable chuck.

2. The apparatus according to claim 1, wherein the light sensor positioned opposite to the array of light-emitting heating elements is positioned on, and/or centred about, a rotational axis of the rotatable chuck.

3. The apparatus according to claim 1, wherein the light sensor positioned opposite to the array of light-emitting heating elements is arranged at a predetermined fixed position relative to the array of light-emitting heating elements.

4. The apparatus according to claim 1, wherein the apparatus comprises a cover that is arranged to prevent stray light from reaching the light sensor positioned opposite to the array of light-emitting heating elements.

5. The apparatus according to claim 4, wherein the light sensor positioned opposite to the array of light-emitting heating elements is positioned on, or attached to, an inside of the cover.

6. The apparatus according to claim 4, wherein the cover is mountable on a frame of a process chamber of the apparatus.

7. The apparatus according to claim 1, wherein the apparatus comprises only a single light sensor positioned opposite to the array of light-emitting heating elements.

8. The apparatus according to claim 1, wherein the light sensor arranged to detect the reflected light and the array of light-emitting heating elements are integrated into a same board of the apparatus.

9. The apparatus according to claim 1, wherein the apparatus comprises a plurality of light sensors arranged to detect light from the array of light-emitting heating elements that is reflected from the wafer when the wafer is received by the rotatable chuck.

10. The apparatus according to claim 1, wherein:
the light-emitting heating elements are LEDs arranged to emit light having a predetermined wavelength, or wavelengths within a predetermined range of wavelengths; and
the one or more light sensors are adapted to detect light having the predetermined wavelength, or wavelengths within the predetermined range of wavelengths.

11. The apparatus according to claim 10, wherein the apparatus comprises an optical filter configured to selectively transmit light having the predetermined wavelength, or wavelengths within the predetermined range of wavelengths.

12. The apparatus according to claim 1, wherein the apparatus further comprises a controller configured to control power supplied to the array of light-emitting heating elements, and to receive a measurement output of the one or more light sensors.

13. The apparatus according to claim 12, wherein the controller is configured to compare a measurement output of the one or more light sensors, or information derived from the measurement output, to a reference value and, based on the comparison:
determine information relating to an operating condition of one or more of the light-emitting heating elements of the array of light-emitting heating elements; and/or
adjust the power supplied to one or more of the light-emitting heating elements of the array of light-emitting heating elements.

14. The apparatus according to claim 12, wherein:
the array of light-emitting heating elements is composed of a plurality of individually controllable groups of light-emitting heating elements; and
the controller is configured to individually control power supplied to each of the individually controllable plurality of groups of light-emitting heating elements.

15. The apparatus according to claim 14, wherein the controller is configured to:
receive a measurement output from the one or more light sensors that is indicative of an illumination intensity of one of the individually controllable plurality of groups of light-emitting heating elements;
compare the measurement output, or information derived from the measurement output, for that group of light-emitting heating elements with a reference value for that group; and
based on the comparison:
determine information relating to an operating condition of that group of light-emitting heating elements; and/or
control power supplied to that group of light-emitting heating elements.

16. The apparatus according to claim 13, wherein the reference value is a previous measurement output from the one or more light sensors, or is derived from the previous measurement output.

17. A method of controlling an apparatus according to claim 1, the method comprising:
supplying power to the array of light-emitting heating elements;
receiving a measurement output from the one or more light sensors;
comparing the measurement output, or information derived from the measurement output, to a reference value; and
based on the comparison:
determining information relating to an operating condition of the array of light-emitting heating elements; and/or
controlling power supplied to the array of light-emitting heating elements.

18. The method according to claim 17, wherein the method comprises:
selectively suppling power to one or more of the light-emitting heating elements; and determining information relating to an operating condition of the one or more of the light-emitting heating elements.

\* \* \* \* \*